(12) United States Patent
Chiang et al.

(10) Patent No.: US 8,710,898 B1
(45) Date of Patent: Apr. 29, 2014

(54) TRIPLE-TRIM REFERENCE VOLTAGE GENERATOR

(71) Applicant: Lattice Semiconductor Corporation, Hillsboro, OR (US)

(72) Inventors: David H. Chiang, Beaverton, OR (US); Cliff A. Mair, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/653,827

(22) Filed: Oct. 17, 2012

(51) Int. Cl.
*G06G 7/12* (2006.01)
*H03F 1/30* (2006.01)

(52) U.S. Cl.
CPC .................................. *H03F 1/301* (2013.01)
USPC ........................................................ 327/362

(58) Field of Classification Search
CPC ..... H03F 1/301; H03K 19/00384; G01K 7/01
USPC ......... 327/362, 378, 512, 513, 530, 534–539, 327/543; 323/312, 313
See application file for complete search history.

(56) References Cited

U.S. PATENT DOCUMENTS

| | | | |
|---|---|---|---|
| 5,952,873 | A | 9/1999 | Rincon-Mora |
| 6,031,365 | A | 2/2000 | Sharpe-Geisler |
| 6,720,755 | B1 | 4/2004 | Sharpe-Geisler |
| 6,769,298 | B2 * | 8/2004 | Matsumura et al. ........ 73/204.15 |
| 6,891,358 | B2 * | 5/2005 | Marinca ........................ 323/316 |
| 2006/0043957 | A1 * | 3/2006 | Carvalho ....................... 323/313 |
| 2006/0261882 | A1 | 11/2006 | Johnson |

OTHER PUBLICATIONS

Ka Nang Leung et al., "A 2-V 23-mA 5.3-ppm/oC Curvature-Compensated CMOS Bandgap Voltage Reference," IEEE Journal of Solid-State Circuits, vol. 38, No. 3, Mar. 2003, pp. 561-564.
Karel E. Kuijk, "A Precision Reference Voltage Source," IEEE Journal of Solid-State Circuits, vol. SC-8, No. 3, Jun. 1973, pp. 222-226.
Gabriel A. Rincon-Mora et al., "A 1.1-V Current-Mode and Piecewise-Linear Curvature-Corrected Bandgap Reference," IEEE Journal of Solid-State Circuits, vol. 33, No. 10, Oct. 1998, pp. 1551-1554.
Linear Technology Corp., "SOT-23 Precision Wide Supply High Output Drive Low Noise Reference," LT6654, Dec. 2010, pp. 1-18.
Burr-Brown Corporation, "Precison Voltage Reference," REF10, Oct. 1993, pp. 1-7.

* cited by examiner

*Primary Examiner* — Sibin Chen

(57) ABSTRACT

In one embodiment, a bandgap reference circuit is designed with three trimmable elements to generate a temperature-independent bandgap reference voltage $V_{BG}$: a $V_{BG}$ adjustment resistance $\Delta R_1$, a $V_{BG}$ slope adjustment resistance $\Delta R_2$, and a curvature compensation adjustment voltage $V_{CU}$. Instances of the bandgap reference circuit can be trimmed in two phases: a characterization phase during which a triple-trim process determines design-specific trim values for the $V_{BG}$ slope adjustment resistance $\Delta R_2$ and the curvature compensation adjustment voltage $V_{CU}$ and a production phase during which a single-trim process determines instance-specific values for the $V_{BG}$ adjustment resistance $\Delta R_1$. Since the characterization phase can be applied to a relatively small number of instances of the bandgap reference circuit, the two-phase trimming technique is suitable for efficient mass production and high production yield.

16 Claims, 9 Drawing Sheets

US 8,710,898 B1

TRIPLE-TRIM REFERENCE VOLTAGE GENERATOR

TECHNICAL FIELD

The present invention relates to electronics, and, more specifically but not exclusively, to reference voltage generators, such as bandgap reference circuits.

BACKGROUND

This section introduces aspects that may help facilitate a better understanding of the invention. Accordingly, the statements of this section are to be read in this light and are not to be understood as admissions about what is prior art or what is not prior art.

A bandgap reference circuit is a type of reference voltage generator designed to generate an output signal having a temperature-insensitive dc voltage. Ideally, a bandgap reference circuit generates a fixed voltage level for all temperature conditions. In an attempt to achieve this temperature independence, conventional bandgap reference circuits have been designed with certain trim methodologies that enable the circuits to be trimmed (i.e., tuned) to be less temperature dependent. Such conventional methodologies are not sufficiently suitable for mass production.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
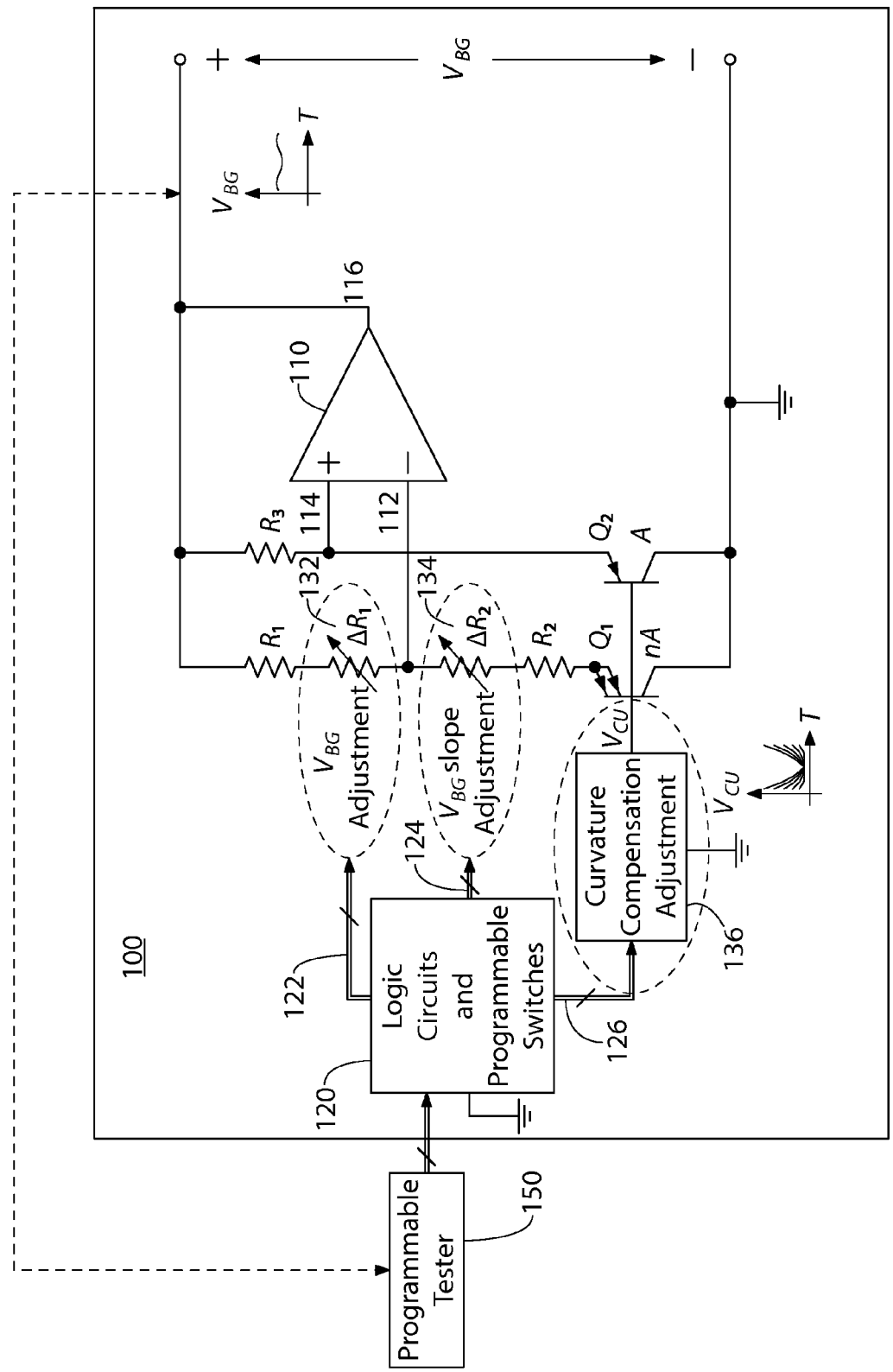
FIG. 1 shows a schematic circuit diagram of a bandgap reference circuit according to one embodiment of the disclosure.

FIG. 1 shows a schematic circuit diagram of an integrated bandgap reference circuit 100 that generates a desired bandgap voltage level $V_{BG}$, according to one embodiment of the disclosure. As shown in FIG. 1, bandgap reference circuit 100 includes operational amplifier (op amp) 110 having negative input node 112, positive input node 114, and output node 116, where the desired bandgap voltage level $V_{BG}$ appears.

In order to compensate for temperature variations, the bandgap reference circuit 100 employs a triple-trim methodology involving an off-chip programmable tester 150 that controls on-chip logic circuits and programmable switches 120 to set digital trim values 122, 124, and 126 that respectively set three different, independent parameters: the $V_{BG}$ adjustment resistance $\Delta R_1$ of variable resistor 132, the $V_{BG}$ slope adjustment resistance $\Delta R_2$ of variable resistor 134, and the curvature compensation adjustment voltage $V_{CU}$ generated by curvature compensation adjustment circuitry 136. A device or circuitry, such as variable resistors 132 and 134 and circuitry 136, that are capable of being trimmed are referred to herein as being trimmable.

As shown in FIG. 1, variable resistor 132 or $\Delta R_1$ provides the $V_{BG}$ adjustment and is used to control the total resistance $(R_1+\Delta R_1)$ between output node 116 and negative input node 112 of op amp 110. Variable resistor 134 or $\Delta R_2$ provides the $V_{BG}$ slope adjustment and is used to control the total resistance $(R_2+\Delta R_2)$ between negative input node 112 of op amp 110 and the emitter of transistor $Q_1$. Note that variable resistors 132 and 134 can be implemented using any suitable configuration of series and/or parallel resistor arrays with switches controlled based on code values 122 and 124 received from logic circuits and programmable switches 120 to set specific resistance levels.

Curvature compensation adjustment circuitry 136 generates the curvature compensation adjustment voltage $V_{CU}$ based on trim code 126 received from logic circuits and programmable switches 120. An exemplary implementation of curvature compensation adjustment circuitry 136 for a single code value is taught in FIG. 1a of U.S. Pat. No. 5,952,873, the teachings of which are incorporated herein by reference. Those skilled in the art will understand how to extend those teachings for multiple different code values.

The curvature compensation adjustment voltage $V_{CU}$ is the base voltage of transistors $Q_1$ and $Q_2$ (also referred to herein as the transistor control voltage) applied to control both transistors $Q_1$ and $Q_2$. Note that, as indicated in FIG. 1, transistor $Q_1$ is n times larger than transistor $Q_2$, where n is greater than one. In one embodiment, transistors $Q_1$ and $Q_2$ are parasitic pnp BJT (bipolar junction transistor) devices implemented in CMOS (complementary metal oxide semiconductor), or regular pnp/npn devices used in BiCMOS (bipolar CMOS) or bipolar technology.

If the op amp 110 is assumed to be ideal, then the bandgap voltage $V_{BG}$ generated by bandgap reference circuit 100 may be represented by Equation (1) as follows:

$$V_{BG}(T, \Delta R_1, \Delta R_2) = T\frac{k}{q}\ln(n)\left(1 + \frac{R_1 + \Delta R_1}{R_2 + \Delta R_2}\right) + V_{EB,Q1}(T) + V_{CU}(T) \quad (1)$$

where:

T is the operating temperature in degrees Kelvin;
k is the Boltzmann constant;
q is the elementary electric charge constant; and
$V_{EB,Q1}$ is the emitter-to-base voltage of transistor $Q_1$.

As indicated in Equation (1), both the emitter-to-base voltage $V_{EB,Q1}$ and the curvature compensation adjustment voltage $V_{CU}$ depend on the operating temperature T.

Figure 2:
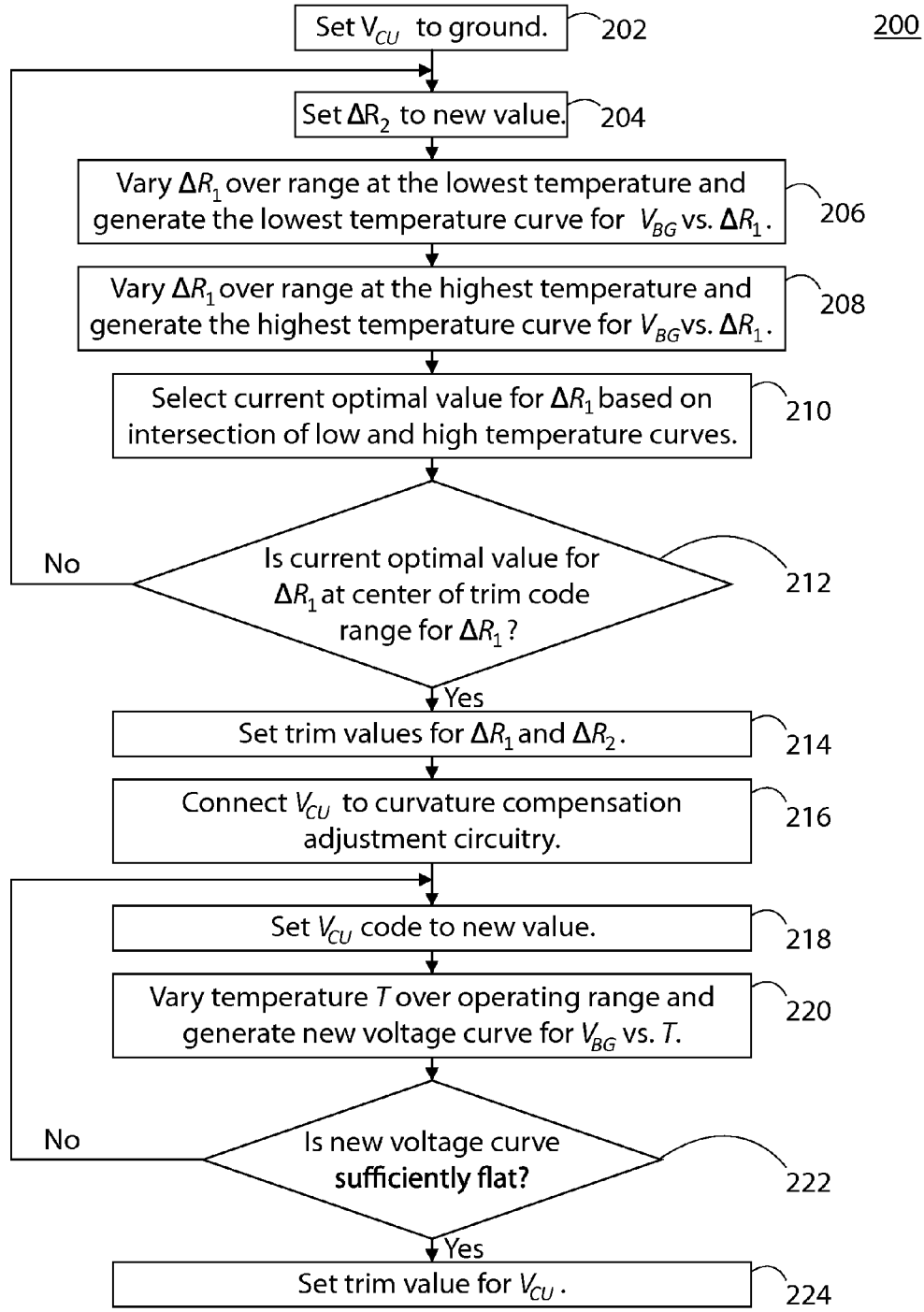
FIG. 2 shows a flow diagram of a triple-trim process implemented during a characterization phase by the programmable tester of FIG. 1 to trim the bandgap reference circuit of FIG. 1 for improved temperature independence.

FIG. 2 shows a flow diagram of triple-trim process 200 implemented during a characterization phase by programmable tester 150 and logic circuits and programmable switches 120 to trim bandgap reference circuit 100 for improved temperature independence. For a particular integrated circuit design, bandgap reference circuit 100 can be trimmed during two different phases: a characterization phase and a production phase. During the characterization phase, triple-trim process 200 is implemented to determine design-specific trim values for the $V_{BG}$ slope adjustment resistance $\Delta R_2$ and the curvature compensation adjustment voltage $V_{CU}$ that are applied to all instances of bandgap reference circuit 100. During the production phase, a single-trim process (described in further detail below in the context of FIG. 9) is implemented for each different instance of (e.g., each different chip containing) bandgap reference circuit 100 to determine an instance-specific trim value for the $V_{BG}$ adjustment resistance $\Delta R_1$ for the current instance of bandgap reference circuit 100. Since the triple-trim process 200 can be implemented as few as one single time for a particular integrated circuit design, mass production of bandgap reference circuit 100 can be efficiently achieved using the combination of (i) a relatively small number of implementations of triple-trim process 200 for the design itself and (ii) a different implementation of the single-trim process of FIG. 9 for each different instance of the design.

Triple-trim process 200 involves two different stages. During the first stage (steps 202-214), trim values for the $V_{BG}$ adjustment resistance $\Delta R_1$ and the $V_{BG}$ slope adjustment resistance $\Delta R_2$ are determined, while a trim value for the curvature compensation adjustment voltage $V_{CU}$ is determined during the second stage (steps 216-224). In one implementation of triple-trim process 200, the goal of the first stage is to find a value for the $V_{BG}$ slope adjustment resistance $\Delta R_2$ that places an optimal (i.e., zero temperature coefficient) value for the $V_{BG}$ adjustment resistance $\Delta R_1$ at (or at least near) the middle of the range of available resistance levels for variable resistor 132, and the goal of the second stage is to find a trim value for the curvature compensation adjustment voltage $V_{CU}$ that provides substantial temperature independence given those two resistance values.

In particular, at the beginning of the first stage, programmable tester 150 and logic circuits and programmable switches 120 set the base voltage $V_{CU}$ to zero (step 202) and the $V_{BG}$ slope adjustment resistance $\Delta R_2$ to first value a (step 204). Note that setting the base voltage $V_{CU}$ to zero can be achieved by connecting the bases of transistors $Q_1$ and Q2 to ground and not (as shown in FIG. 1) to curvature compensation adjustment circuitry 136. In one implementation, the first value a for the $V_{BG}$ slope adjustment resistance $\Delta R_2$ is the middle of the range of available resistance levels for variable resistor 134.

In step 206, with the ambient temperature set at the lowest temperature in the operating range for which bandgap reference circuit 100 is to be trimmed, programmable tester 150 and logic circuits and programmable switches 120 vary the $V_{BG}$ adjustment resistance $\Delta R_1$ over the range of available resistance levels for variable resistor 132 and measures the bandgap voltage $V_{BG}$ as a function of the $V_{BG}$ adjustment resistance $\Delta R_1$. In step 208, with the ambient temperature set at the highest temperature in the operating range, programmable tester 150 and logic circuits and programmable switches 120 vary the $V_{BG}$ adjustment resistance $\Delta R_1$ over the range of available resistance levels for variable resistor 132 and measures the bandgap voltage $V_{BG}$ as a function of the $V_{BG}$ adjustment resistance $\Delta R_1$.

In one implementation, bandgap reference circuit 100 is designed to operate over a specified temperature range (e.g., −45 C to +105 C), where step 206 is implemented at the lowest operating temperature (e.g., −45 C), and step 208 is implemented at the highest operating temperature (e.g., +105 C). In that case, triple-trim process 200 will trim bandgap reference circuit 100 for that operating range. Note that additional steps analogous to steps 206 and 208 can be implemented at other temperatures to determine trim values for bandgap reference circuit 100 for other operating ranges.

Figure 3:
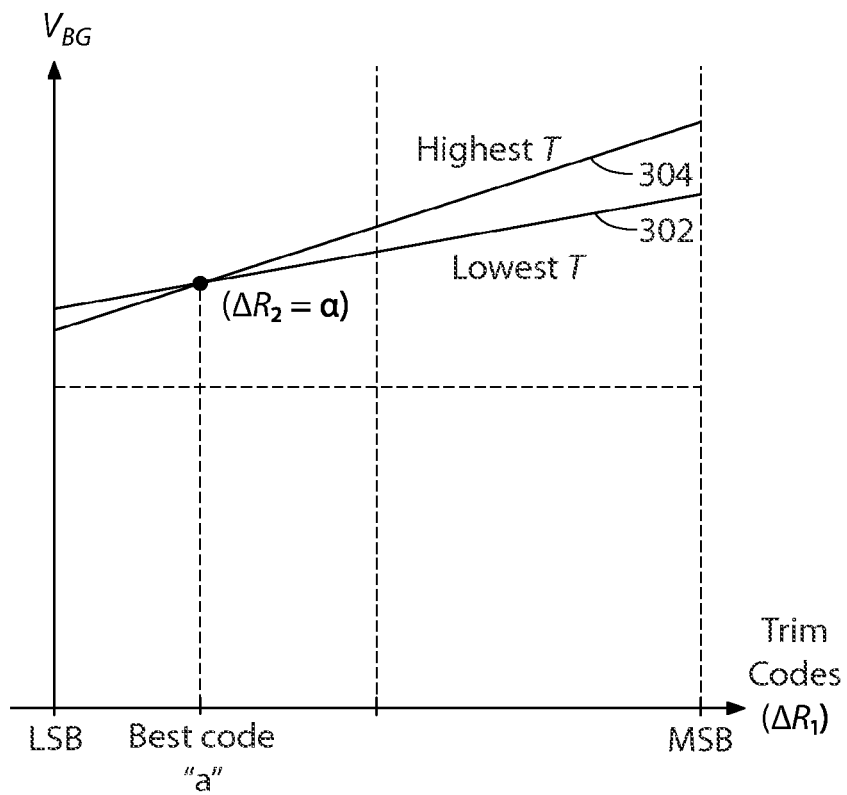
FIG. 3 shows graphical representations of the results of an exemplary instance of steps 206 and 208 of FIG. 2 for a first value a of the variable resistor 134 of FIG. 1.

FIG. 3 shows graphical representations of the results of an exemplary instance of steps 206 and 208 with the $V_{BG}$ slope adjustment resistance $\Delta R_2$ set to the first value a, where a first line 302 corresponds to the relationship between the $V_{BG}$ adjustment resistance $\Delta R_1$ and the bandgap voltage $V_{BG}$ at the lowest operating temperature, while a second line 304 corresponds to the relationship between the $V_{BG}$ adjustment resistance $\Delta R_1$ and the bandgap voltage $V_{BG}$ at the highest operating temperature. The point where the two lines intersect indicates the "optimal" or "best-code" value to use for the $V_{BG}$ adjustment resistance $\Delta R_1$ in terms of achieving zero temperature coefficient a specific temperature (e.g., at $T_0$ shown in FIG. 4) when (i) the $V_{BG}$ slope adjustment resistance $\Delta R_2$ is set to its first (e.g., mid-range) value a and (ii) the base voltage $V_{CU}$ is set to zero. In step 210, programmable tester 150 and logic circuits and programmable switches 120 determine this first optimal value for the $V_{BG}$ adjustment resistance $\Delta R_1$.

Figure 4:
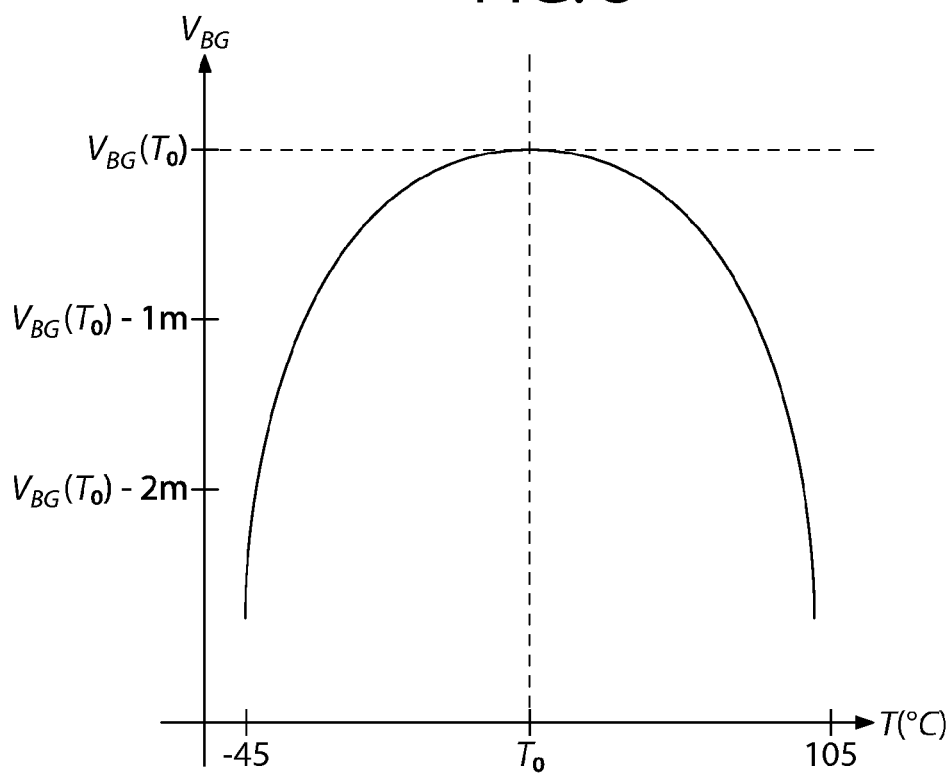
FIG. 4 shows a graphical representation of the temperature dependence of the bandgap reference circuit of FIG. 1 with a zero voltage value for $V_{CU}$ and optimized values for $\Delta R_1$ and $\Delta R_2$ to obtain zero temperature coefficient of $V_{BG}$ at temperature $T_0$ in FIG. 4.

FIG. 4 shows a graphical representation of the bandgap voltage $V_{BG}$ versus temperature when (i) the $V_{BG}$ slope adjustment resistance $\Delta R_2$ is set to its first (e.g., mid-range) value a, (ii) the base voltage $V_{CU}$ is set to zero, and (iii) the $V_{BG}$ adjustment resistance $\Delta R_1$ is set to the optimal value indicated by the point of intersection in FIG. 3. Note that, at these settings, the operation of bandgap reference circuit 100 has zero temperature coefficient at $T_0$ shown in FIG. 4.

Referring again to FIG. 2, at step 212, programmable tester 150 and logic circuits and programmable switches 120 determine whether the current optimal value for the $V_{BG}$ adjustment resistance $\Delta R_1$ is sufficiently close to the middle of the range of available resistance levels of resistor 132. If so, then processing continues to step 214, which is described below. If not, then processing returns to step 204 to select a new value for the $V_{BG}$ slope adjustment resistance $\Delta R_2$.

Figure 5:
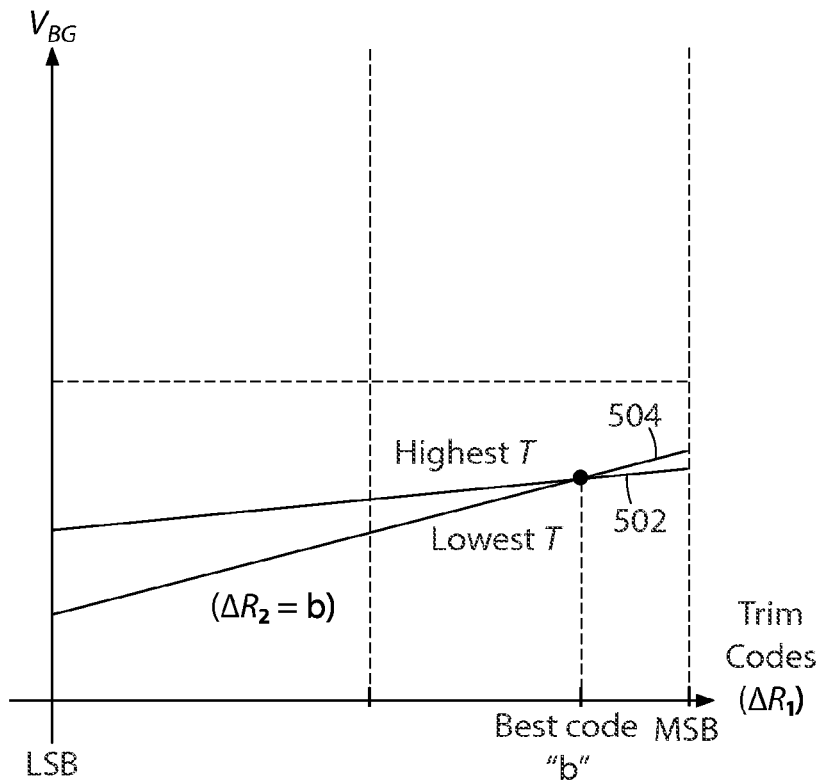
FIG. 5 shows graphical representations of the results of an exemplary instance of steps 206 and 208 of FIG. 2 for a second value b of the variable resistor 134 of FIG. 1.
Figure 6:
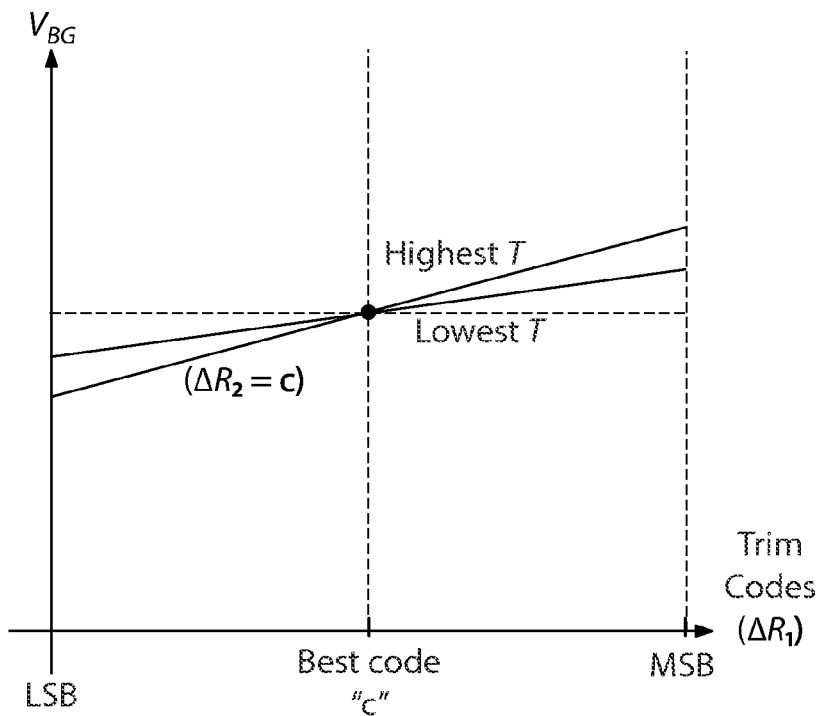
FIG. 6 shows graphical representations of the results of an exemplary instance of steps 206 and 208 of FIG. 2 for a third value c of the variable resistor 134 of FIG. 1.

As shown in FIG. 3, in this exemplary instance of steps 206 and 208, the first optimal value for the $V_{BG}$ adjustment resistance $\Delta R_1$ is below the middle of the range of available resistance levels of resistor 132. In other exemplary instances, the first optimal value for the $V_{BG}$ adjustment resistance $\Delta R_1$ may be above the middle of the range as shown in FIG. 5. In either case, when returning to step 204, programmable tester 150 and logic circuits and programmable switches 120 attempt to select the new value for the $V_{BG}$ slope adjustment resistance $\Delta R_2$ to achieve an optimal value for the $V_{BG}$ adjustment resistance $\Delta R_1$ at the middle of the range of available resistance levels of resistor 132 as shown in FIG. 6.

For conditions T=lowest operating temperature $T_1$, $\Delta R_2$=a, and $V_{CU}$=0, Equation (1) can be rearranged to yield Equation (2) as follows:

$$V_{BG}(T_1, \Delta R_1, a) = T_1 \frac{k}{q} \ln(n)\left(1 + \frac{R_1 + \Delta R_1}{R_2 + \Delta R_2}\right) + V_{EB,Q1}(T) = \quad (2)$$

$$T_1 \frac{k}{q}\ln(n) + T_1 \frac{k}{q}\ln(n) \frac{R_1 + \Delta R_1}{R_2 + \Delta R_2} + V_{EB,Q1}(T_1) = \left[T_1 \frac{k}{q}\ln(n) + \right.$$

$$\left. V_{EB,Q1}(T_1) + T_1 \frac{k}{q}\ln(n) \frac{R_1}{R_2 + \Delta R_2}\right] + \left[T_1 \frac{k}{q}\ln(n) \frac{1}{R_2 + \Delta R_2}\right]\Delta R_1$$

Equation (2) is a linear equation Y=b+mX, with Y=$V_{BG}$ ($T_1,\Delta R_1$,a), X=$\Delta R_1$, the y-intercept b=

$$\left[T_1 \frac{k}{q}\ln(n) + V_{EB,Q1}(T_1) + T_1 \frac{k}{q}\ln(n) \frac{R_1}{R_2 + \Delta R_2}\right],$$

and the slope $m = \left[T_1 \frac{k}{q}\ln(n) \frac{1}{R_2 + \Delta R_2}\right]$.

From Equation (2), if $\Delta R_2$ is increased in FIG. 3, then the slopes and the y-intercepts of the high-temperature and low-temperature lines in FIG. 3 are decreased, and vice versa. Hence, the location of the best code point will be moved if $\Delta R_2$ is changed.

If the first optimal value for the $V_{BG}$ adjustment resistance $\Delta R_1$ is below or above the middle of the range of available resistance levels of resistor 132, as in FIG. 3 or FIG. 5, then, in step 204, programmable tester 150 and logic circuits and programmable switches 120 attempt to select a next value for the $V_{BG}$ slope adjustment resistance $\Delta R_2$.

After selecting the next value for the $V_{BG}$ slope adjustment resistance $\Delta R_2$ in step 204, steps 206-212 are repeated.

FIG. 5 shows graphical representations of the results of an exemplary instance of steps 206 and 208 using the value b for the $V_{BG}$ slope adjustment resistance $\Delta R_2$, where a first line 502 corresponds to the relationship between the $V_{BG}$ adjustment resistance $\Delta R_1$ and the bandgap voltage $V_{BG}$ at the lowest operating temperature, while a second line 504 corresponds to the relationship between the $V_{BG}$ adjustment resistance $\Delta R_1$ and the bandgap voltage $V_{BG}$ at the highest operating temperature.

The point where the two lines intersect (as determined in step 210) indicates the "optimal" value to use for the $V_{BG}$ adjustment resistance $\Delta R_1$ in terms of achieving zero temperature coefficient of $V_{BG}$ at temperature $T_o$ in FIG. 4 when (i) the $V_{BG}$ slope adjustment resistance $\Delta R_2$ is set to value b and (ii) the base voltage $V_{CU}$ is set to zero. In this exemplary case, the optimal value for the $V_{BG}$ adjustment resistance $\Delta R_1$ is above the middle of the range of available resistance levels of resistor 132. As such, as a result of step 212, processing will again return to step 204 to select another value for the $V_{BG}$ slope adjustment resistance $\Delta R_2$.

This processing of steps 204-212 continues until a value c for the $V_{BG}$ slope adjustment resistance $\Delta R_2$ is selected such that the intersection of the two lines corresponding to the relationships between the $V_{BG}$ adjustment resistance $\Delta R_1$ and the bandgap voltage $V_{BG}$ at the lowest and highest operating temperatures coincides with the mid-range value for the $V_{BG}$ adjustment resistance $\Delta R_1$, as represented in FIG. 6. At that point, step 212 is satisfied, and processing continues to step 214, where the current value for the $V_{BG}$ slope adjustment resistance $\Delta R_2$ is retained as the trim value 124 for all instances of bandgap reference circuit 100, while the current value for the $V_{BG}$ adjustment resistance $\Delta R_1$ can be retained as the trim value 122 for this particular instance of bandgap reference circuit 100.

The second stage of the triple-trim process 200 is then performed in steps 216-224 of FIG. 2 with the $V_{BG}$ slope adjustment resistance $\Delta R_2$ set at the value c and the $V_{BG}$ adjustment resistance $\Delta R_1$ set at its mid-range value, as in FIG. 6.

Figure 7:
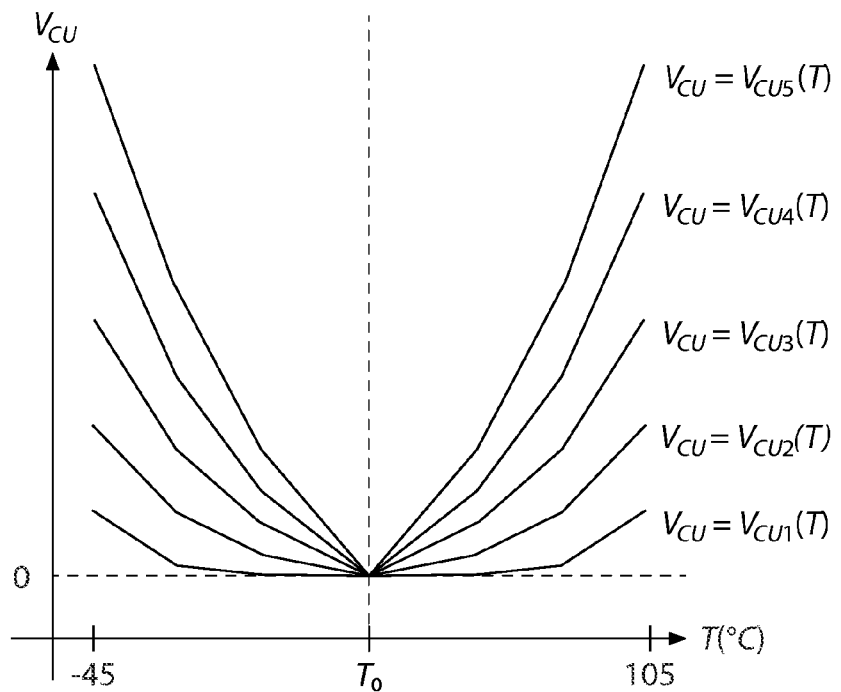
FIG. 7 shows graphical representations of the relationship between the operating temperature and the base voltage $V_{CU}$ of transistors $Q_1$ and $Q_2$ for five different $V_{CU}$ code values for the curvature compensation adjustment circuitry of FIG. 1.

FIG. 7 shows graphical representations of the relationship between the base voltage $V_{CU}$ of transistors $Q_1$ and $Q2$ and the operating temperature for five different $V_{CU}$ values ($V_{CU1}$-$V_{CU5}$) applied by logic circuits and programmable switches 120 to curvature compensation adjustment circuitry 136. The goal of the second stage of the triple-trim process 200 is to find a trim value for the base voltage $V_{CU}$ to compensate for the temperature dependence of the voltage $V_{BG}$ in FIG. 4 with $V_{CU}$=0.

In particular, at step 216, curvature compensation adjustment circuitry 136 is connected to control the base voltage $V_{CU}$ applied to transistors $Q_1$ and $Q_2$. At step 218, the programmable tester 150 controls the logic circuits and programmable switches 120 and selects a particular code value to apply to curvature compensation adjustment circuitry 136 to generate the base voltage $V_{CU}$ and, at step 220, the bandgap circuit temperature T is varied over the full range of operating temperatures, and the bandgap reference voltage $V_{BG}$ as a function of the varying temperature is recorded.

Figure 8:
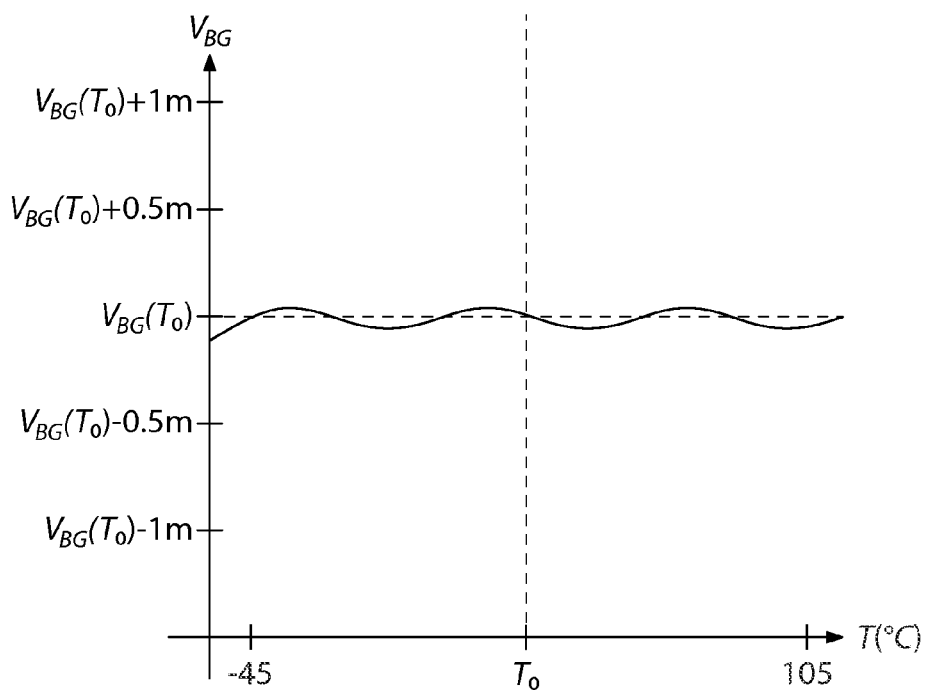
FIG. 8 shows a graphical representation of the relationship between the operating temperature and the bandgap voltage $V_{BG}$ after the bandgap reference circuit of FIG. 1 has been tuned using the triple-trim process of FIG. 2.

Steps 218 and 220 are repeated for different $V_{CU}$ code values until the bandgap reference voltage $V_{BG}$ is sufficiently constant over the full range of operating temperatures, as represented by the substantially flat curve in FIG. 8. In particular, if the resulting voltage curve is not sufficiently flat (step 222), then steps 218 and 220 are repeated with a new $V_{CU}$ code value selected. If and when the resulting voltage curve is sufficiently flat, then, in step 224, the current $V_{CU}$ code value is saved as the trim value 126 for the curvature compensation adjustment circuitry 136 for bandgap reference circuit 100.

Note that, instead of implementing the triple-trim process 200 of FIG. 2 only once, the triple-trim process can be implemented for a (relatively small) number of different instances of bandgap reference circuit 100 to determine an average $\Delta R_2$ trim value 124 for resistor 134 and an average $V_{CU}$ trim value 126 for curvature compensation adjustment circuitry 136 to be used for all instances of bandgap reference circuit 100 during the production phase described below in reference to FIG. 9.

Thus, for a given integrated circuit design for bandgap reference circuit 100, during the (e.g., mass) production phase, the same trim value 124 for the $V_{BG}$ slope adjustment resistance $\Delta R_2$ and the same trim value 126 for the base voltage $V_{CU}$ can be used for all instances of that design, while a different trim value 122 for the $V_{BG}$ adjustment resistance $\Delta R_1$ is determined for each different instance to achieve optimal temperature independence. This means that the entire triple-trim process 200 of FIG. 2 needs to be performed only a limited number of times for each different design during the characterization phase, while an abbreviated single-trim process can then be performed for each different instance of that design to determine an instance-specific trim value 122 for the $V_{BG}$ adjustment resistance $\Delta R_1$ during the production phase.

Figure 9:
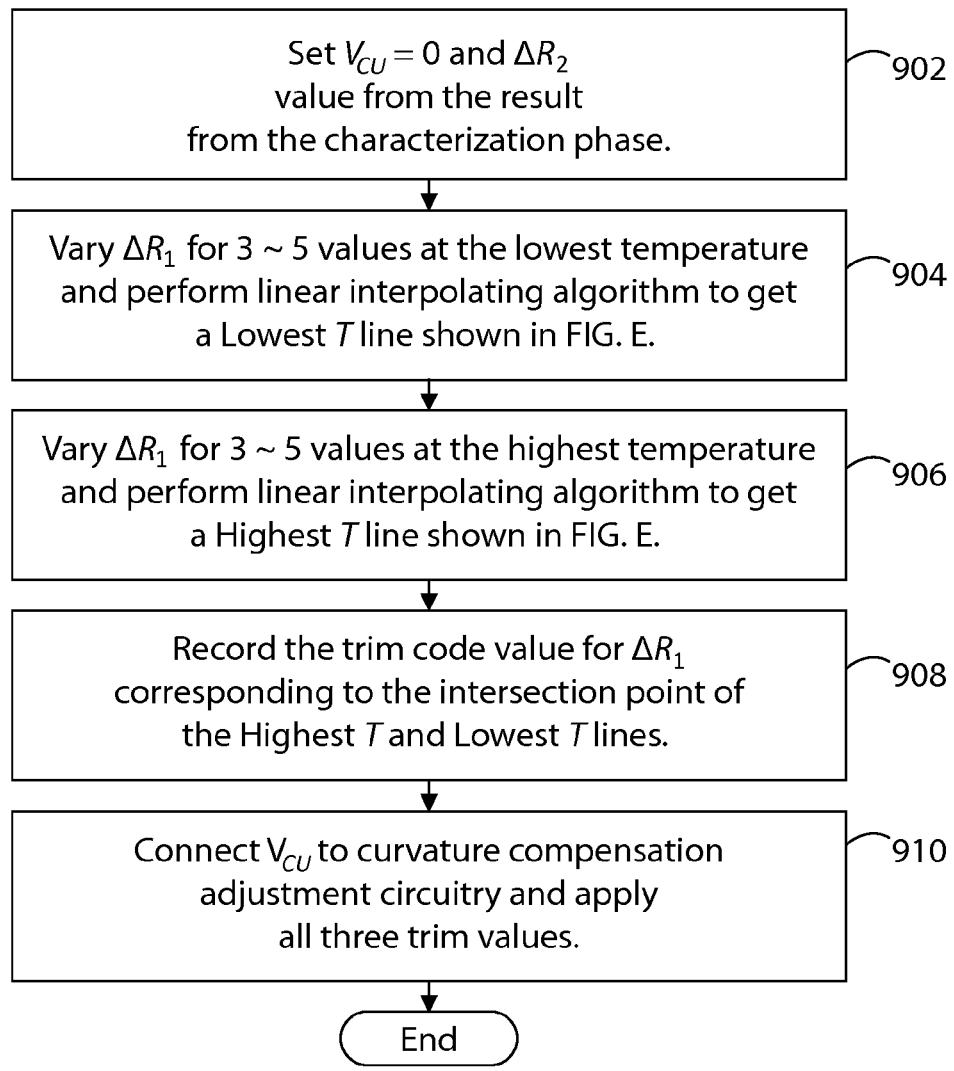
FIG. 9 shows a flow diagram of a single-trim process implemented during a production phase by the programmable tester of FIG. 1 to trim different instances of the bandgap reference circuit of FIG. 1 for improved temperature independence.

FIG. 9 shows a flow diagram of a single-trim process 900 implemented during the production phase by programmable tester 150 and logic circuits and programmable switches 120 of FIG. 1 to trim each different instance of bandgap reference circuit 100 of FIG. 1 for improved temperature independence.

In particular, in step 902, programmable tester 150 and logic circuits and programmable switches 120 set (i) the base voltage $V_{CU}$ to zero (e.g., by connecting the bases of transistors $Q_1$ and $Q_2$ to ground) and (ii) the $\Delta R_2$ code to the corresponding trim code 124 determined during the characterization phase using triple-trim process 200.

In step 904, with the bandgap circuit temperature set at the lowest temperature in the operating range for which bandgap reference circuit 100 is to be trimmed, programmable tester 150 and logic circuits and programmable switches 120 vary the $V_{BG}$ adjustment resistance $\Delta R_1$ over the range of available resistance levels for variable resistor 132 and measures the bandgap voltage $V_{BG}$ as a function of the $V_{BG}$ adjustment resistance $\Delta R_1$. Similarly, in step 906, with the bandgap circuit temperature set at the highest temperature in the operating range, programmable tester 150 and logic circuits and programmable switches 120 vary the $V_{BG}$ adjustment resistance $\Delta R_1$ over the range of available resistance levels for variable resistor 132 and measure the bandgap voltage $V_{BG}$ as a function of the $V_{BG}$ adjustment resistance $\Delta R_1$. Note that, in order to achieve efficiency during the production phase, only a few (e.g., 3-5) different values of the $V_{BG}$ adjustment resistance $\Delta R_1$ need to be selected at each of the lowest and highest temperature settings with a linearly interpolating algorithm used to generate lines similar to that shown in FIG. 6.

In step 908, the $\Delta R_1$ trim value 122 for the current instance of bandgap reference circuit 100 is determined based on the intersection of the low- and high-temperature lines based on the results from steps 904 and 906. Note that steps 904, 906, and 908 are analogous to steps 206, 208, and 210, respectively, of FIG. 2.

In step 910, the base of transistors $Q_1$ and Q2 is connected to curvature compensation adjustment circuitry 136 with its trim code decided in step 224 in FIG. 2, and all three trim values 122, 124, and 126 are applied to bandgap reference circuit 100. At this point, the current instance of bandgap reference circuit 100 is triple-trimmed for temperature-independent operations.

The combination of the characterization-phase, triple-trim process 200 of FIG. 2 and the production-phase, single-trim process 900 of FIG. 9 makes the architecture of bandgap reference circuit 100 shown in FIG. 1 suitable for mass production and high production yield. Note that, if desired, the triple-trim process 200 could, in theory, be implemented for each different instance of bandgap reference circuit 100 to determine instance-specific values for all three trim codes 122, 124, and 126.

Although the invention has been described in the context of a bandgap reference circuit having variable resistors 132 and 134 connected to negative input node 112 of op amp 110, in alternative embodiments, different configurations of variable resistors are possible. For example, a variable resistor $\Delta R_3$ could be connected in series with resistor $R_3$ between output node 116 and positive input node 114 of op amp 110. In that case, appropriate changes may need to be made to the trim process by adjusting $\Delta R_3$ instead of $\Delta R_1$.

Figure 10:
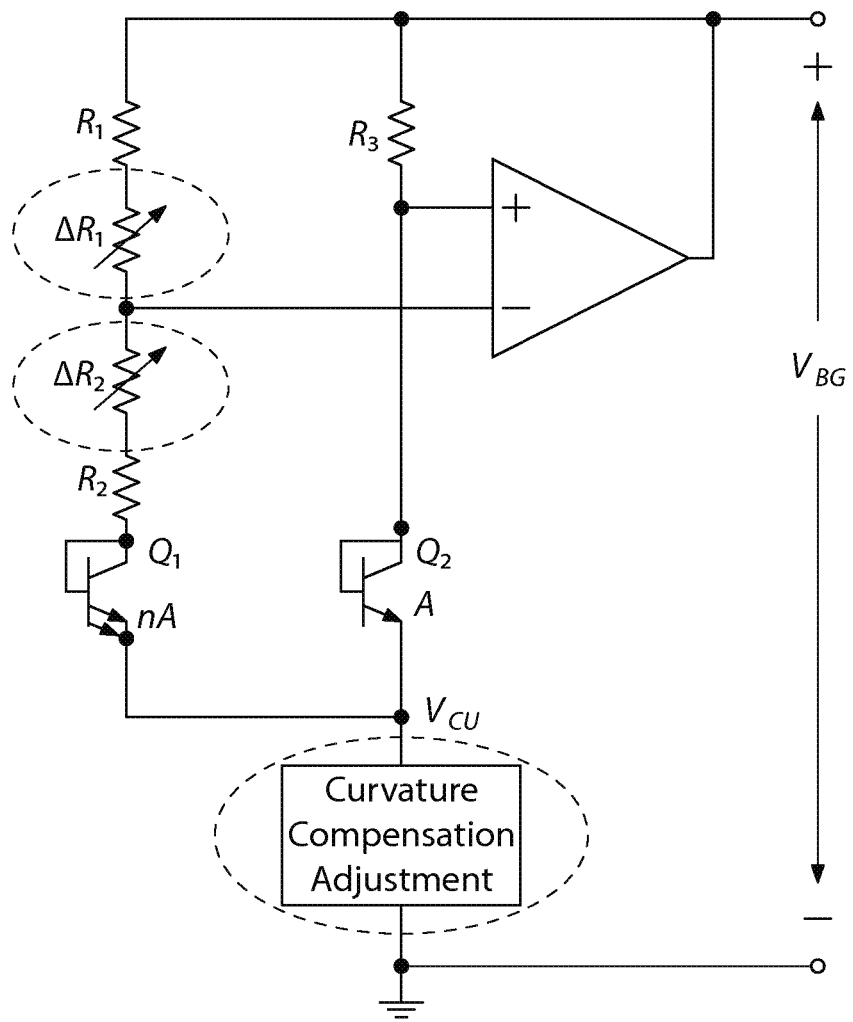
FIG. 10 shows a schematic circuit diagram of a bandgap reference circuit according to another embodiment of the disclosure.

Although bandgap reference circuit 100 of FIG. 1 has pnp transistors $Q_1$ and $Q_2$, bandgap reference circuits of the disclosure can also be implemented in the context of bandgap reference circuits implemented using npn transistors, such as shown in FIG. 10. Note that, in the npn implementation of FIG. 10, the two transistor control nodes that are connected to the curvature compensation adjustment circuitry are the emitters of the two npn transistors. Otherwise, the architecture is the same as that for bandgap reference circuit 100 of FIG. 1.

Figure 11:
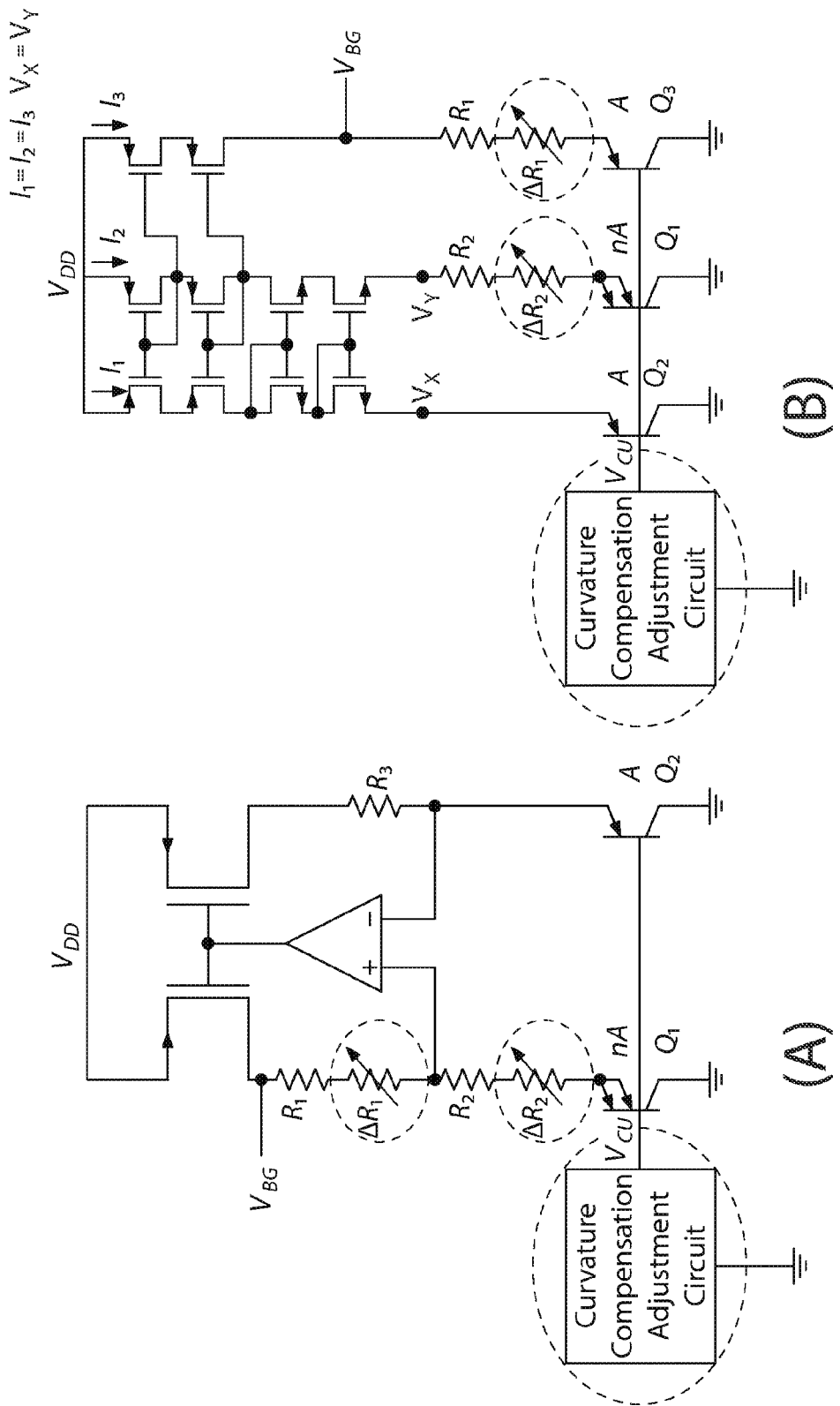
FIGS. 11(A) and 11(B) show schematic circuit diagrams of bandgap reference circuits according to other embodiments of the disclosure.
Figure 12:
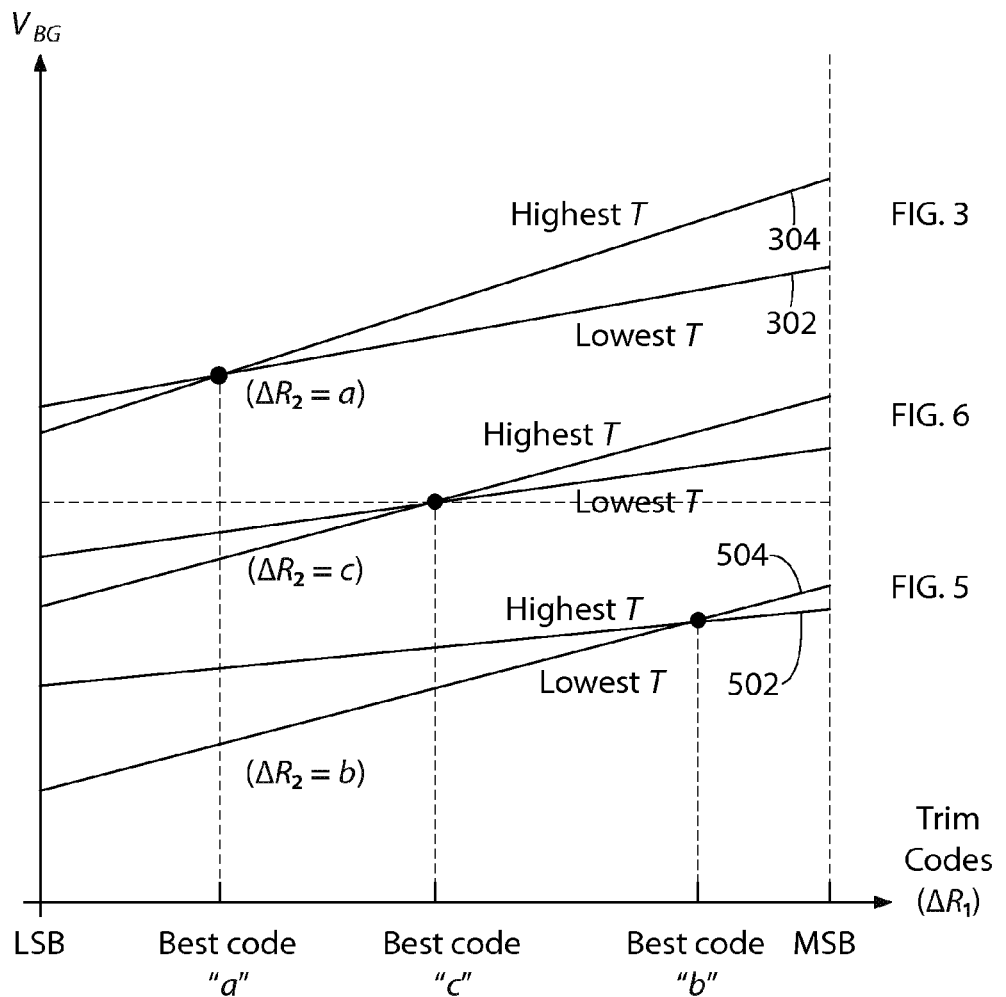
FIG. 12 shows the plots of FIGS. 3, 5, and 6 drawn on a single graph to illustrate the scale and slope relationship between the lowest and highest T lines for the three different values of $\Delta R_2$.

FIGS. 11(A) and 11(B) show schematic circuit diagrams of other bandgap reference circuits to which the triple-trim methodology can be applied. Note that FIGS. 10 and 11 do not show the on-chip logic circuits and programmable switches that are part of those bandgap reference circuits. Nor do those figures show the off-chip programmable tester that is used to perform the triple-trim methodology.

Although the disclosure has been described in the context of specific implementations, those skilled in the art will understand that other implementations are possible. For example, in FIG. 1, variable resistor 132 is located between resistor $R_1$ and input node 112. In an alternative implementation, variable resistor 132 is removed (shorted it out) and the resistor $R_3$ can be replaced by a series combination of $R_3$ and $\Delta R_3$. The connection of $R_1$ and variable resistor 132 can be exchanged. Likewise, the connection of $R_2$ and variable resistor 134 can be exchanged.

Although the disclosure has been described in the context of trim processes that are designed to achieve temperature independence, it is also possible to implement the trim processes of FIGS. 2 and 9 to purposely achieve a desired level of temperature dependence, for example, PTAT (Proportional To Absolute Temperature) or CTAT (Complementary To Absolute Temperature), by using different trim values for $\Delta R_1$, $\Delta R_2$, and circuitry 136 in FIG. 1.

Although the disclosure has been described in the context of a bandgap reference circuit that generates a desired bandgap reference voltage, those skilled in the art will understand that other reference voltage generators can be implemented using similar architectures to generate reference voltage signals at levels other than those for bandgap reference voltages. For example, appropriate amplifiers, attenuators, and/or regulators can be added to the design shown in FIG. 1 to generate other reference voltage signals. In addition, appropriate regulators and current minors can be added to the design shown in FIG. 1 to provide bandgap reference current generators.

The present invention can be implemented in the context of any suitable type of integrated circuit device, such as, without limitation, application-specific integrated circuits (ASICs), data converter circuits, mixed-signal integrated circuits, field-programmable gate arrays (FPGAs), programmable logic devices (PLDs), mask-programmable gate arrays (MP-GAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements (e.g., logic circuits and programmable switches 120) may also be implemented as processing blocks of a software program. Such software may be employed in, for example, a digital signal processor, micro-controller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required.

Conversely, the terms "directly coupled," "directly connected," etc., imply the absence of such additional elements.

Also, for purposes of this description, it is understood that all bases/gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all bases/gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in the claims, the terms "emitter," "collector," and "base" should be understood to refer to the emitter, collector, and base of a bi-polar device used in a bandgap reference circuit, and the bi-polar device is implemented using CMOS, BiCMOS, or bipolar technology.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. Apparatus comprising a reference voltage generator (e.g., 100, for generating a reference voltage signal (e.g., $V_{BG}$), the reference voltage generator comprising:

an operational amplifier (op amp) (e.g., 110) having first and second input nodes (e.g., 112, 114) and an output node (e.g., 116), wherein the reference voltage signal appears at the output node of the op amp;

a first resistance (e.g., R1+ΔR1) connected between the output node and one of first and second input nodes (e.g., 112);

a second resistance (e.g., R2+ΔR2) connected to the first input node;

a first transistor device (e.g., Q1) having an emitter connected to the second resistance and a collector connected to a voltage reference node (e.g., ground);

a third resistance (e.g., R3) connected between the output node and the other of the first and second input nodes (e.g., 114) of the op amp;

a second transistor device (e.g., Q2) having an emitter connected to the second input node of the op amp and a collector connected to the voltage reference node:

a curvature compensation adjustment circuitry selectively connected to control nodes of the first and second transistor devices, wherein the first and second resistances and curvature compensation adjustment circuitry are trimmable;

logic circuits and programmable switches (e.g., 120) configured to enable an external programmable tester (e.g., 150) to set:
- (a) a first resistance level (e.g., ΔR1) for the first resistance;
- (b) a second resistance level (e.g., ΔR2) for the second resistance; and
- (c) a transistor control voltage (e.g., VCU) applied by the curvature compensation adjustment circuitry to the control nodes of the first and second transistor devices;

wherein the programmable tester and the logic circuits and programmable switches support a characterization phase and a production phase, such that:

during the characterization phase, a design-specific trim value is determined for the second resistance level (e.g., ΔR2) and a design-specific trim value is determined for the transistor control voltage (e.g., VCU); and during the production phase, with the second resistance level (e.g., ΔR2) and the transistor control voltage (e.g., VCU) fixed to their design-specific trim values, an instance-specific trim value is determined for the first resistance level (e.g., ΔR1).

2. The invention of claim 1, wherein, during the characterization phase:

with the transistor control voltage set to zero and the second resistance level set at a selected value, the programmable tester and the logic circuits and programmable switches:
- (1) vary the first resistance level at a low temperature and records the reference voltage signal;
- (2) vary the first resistance level at a high temperature and records the reference voltage signal; and
- (3) determine an optimal value for the first resistance level based on the reference voltage signals of steps (1) and (2);

if the programmable tester and the logic circuits and programmable switches determine that the optimal value from step (3) is not located near or at the center of a whole trim code range for the first resistance level, then the programmable tester selects a new value for the second resistance level and repeats steps (1)-(3); and if the programmable tester and the logic circuits and programmable switches determine that code location of the optimal value of the first resistance level is acceptable, then the programmable tester and the logic circuits and programmable switches select one or more code values for the curvature compensation adjustment circuitry to enable a determination, at each selected code value, of whether the reference voltage signal is sufficiently constant over different operating temperatures.

3. The invention of claim 2, wherein, during the production phase, for each instance of the reference voltage generator, with the transistor control voltage set to zero and the second resistance level set at the acceptable optimal value from the characterization phase, the programmable tester and the logic circuits and programmable switches:
- (1) vary the first resistance level at a low temperature and records the reference voltage signal;
- (2) vary the first resistance level at a high temperature and records the reference voltage signal; and
- (3) determine a trim value for the first resistance level based on the reference voltage signals of steps (1) and (2).

4. Apparatus comprising a reference voltage generator for generating a reference voltage signal, the reference voltage generator comprising:

an operational amplifier (op amp) having first and second input nodes and an output node, wherein the reference voltage signal appears at the output node of the op amp;
a first trimmable resistance connected between the output node and the first input node;
a second trimmable resistance connected to the first input node;
a first transistor device connected between the second resistance and a voltage reference node;
a second transistor device connected between the second input node and the voltage reference node;
curvature compensation adjustment circuitry connected to the first and second transistor devices; and
programmable switches for enabling an external programmable tester to set:
- (a) a first resistance level for the first resistance;
- (b) a second resistance level for the second resistance; and
- (c) a transistor control voltage applied by the curvature compensation adjustment circuitry to the first and second transistor devices;

wherein the programmable tester and the programmable switches support a characterization phase and a production phase, such that:

during the characterization phase, a design-specific trim value is determined for the second resistance level and a design-specific trim value is determined for the transistor control voltage; and during the production phase, with the second resistance level and the transistor control voltage fixed to their design-specific trim values, an instance-specific trim value is determined for the first resistance level.

5. The invention of claim 4, wherein the first transistor device is n times larger than the second transistor device, where n is greater than 1.

6. The invention of claim 4, wherein the first and second transistor devices are inherent parasitic bi-polar junction transistors (BJT) implemented in CMOS technology or regular pnp/npn implemented in BiCMOS or bipolar technology.

7. The invention of claim 4, wherein the first and second transistor devices are pnp devices and the curvature compensation adjustment circuitry is connected to bases of the pnp devices.

8. The invention of claim 4, wherein the first and second transistor devices are npn devices and the curvature compensation adjustment circuitry is connected to emitters of the npn devices.

9. The invention of claim 4, wherein:
the first input node is a negative input node of the op amp; and
the second input node is a positive input node of the op amp.

10. The invention of claim 4, wherein the reference voltage generator is a bandgap reference circuit.

11. The invention of claim 4, wherein:
the first input node of the op amp is a negative input node of the op amp;
the second input node of the op amp is a positive input node of the op amp;
the second resistance is connected between the an emitter of the first transistor device and the negative input node of the op amp;
a collector of the first transistor device is connected to ground;
an emitter of the second transistor device is connected to the positive input node of the op amp;

a collector of the second transistor device is connected to the ground; and the curvature compensation adjustment circuitry is selectively connected to the bases of the first and second transistor devices.

12. The reference voltage generator of claim 4 including a third resistance connected between the output node and the second input node.

13. A bandgap reference circuit comprising:
an operational amplifier (op amp) having first and second input nodes and an output node;
a first trimmable resistance connected between the output node and the first input node;
a second trimmable resistance connected to the first input node;
a first transistor device connected between the second resistance and a voltage reference node;
a second transistor device connected between the second input node and the voltage reference node;
curvature compensation adjustment circuitry connected to the first and second transistor devices; and
programmable switches for setting:
(a) a first resistance level for the first resistance;
(b) a second resistance level for the second resistance; and
(c) a transistor control voltage applied by the curvature compensation adjustment circuitry to the first and second transistor devices;

wherein the programmable tester and the programmable switches support a characterization phase and a production phase, such that:

during the characterization phase, a design-specific trim value is determined for the second resistance level and a design-specific trim value is determined for the transistor control voltage; and during the production phase, with the second resistance level and the transistor control voltage fixed to their design-specific trim values, an instance-specific trim value is determined for the first resistance level.

14. The invention of claim 13, wherein the first and second transistor devices are inherent parasitic bi-polar junction transistors (BJT) implemented in CMOS technology or regular pnp/npn implemented in BiCMOS or bipolar technology.

15. The invention of claim 13, wherein the first and second transistor devices are pnp devices and the curvature compensation adjustment circuitry is connected to bases of the pnp devices.

16. The invention of claim 13, wherein the first and second transistor devices are npn devices and the curvature compensation adjustment circuitry is connected to emitters of the npn devices.

* * * * *